United States Patent
Adsure et al.

(10) Patent No.: US 12,248,356 B2
(45) Date of Patent: Mar. 11, 2025

(54) TECHNIQUES TO REDUCE MEMORY POWER CONSUMPTION DURING A SYSTEM IDLE STATE

(71) Applicant: Intel Corporation, Santa Clara, CA (US)

(72) Inventors: Virendra Vikramsinh Adsure, Folsom, CA (US); Chia-Hung S. Kuo, Folsom, CA (US); Robert J. Royer, Jr., Portland, OR (US); Deepak Gandiga Shivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 17/359,403

(22) Filed: Jun. 25, 2021

(65) Prior Publication Data

US 2021/0325956 A1    Oct. 21, 2021

(51) Int. Cl.
*G06F 1/3293*    (2019.01)
(52) U.S. Cl.
CPC .................. *G06F 1/3293* (2013.01)
(58) Field of Classification Search
CPC ..................................... G06F 1/3293
USPC ........................................................ 712/320
See application file for complete search history.

(56) References Cited

U.S. PATENT DOCUMENTS

| | | | | |
|---|---|---|---|---|
| 3,760,379 A | * | 9/1973 | Nibby, Jr. ............. | G11C 11/406 365/222 |
| 5,487,172 A | * | 1/1996 | Hyatt ..................... | G06F 13/16 700/8 |
| 5,561,384 A | * | 10/1996 | Reents ................ | H03K 19/0016 327/566 |
| 5,724,295 A | * | 3/1998 | Beiley .................. | G11C 29/808 365/225.7 |
| 6,141,765 A | * | 10/2000 | Sherman ............. | G06F 13/4217 713/400 |
| 6,515,929 B1 | * | 2/2003 | Ting ...................... | G11C 11/406 365/189.011 |
| 11,520,498 B2 | | 12/2022 | Bonen et al. | |
| 2003/0009632 A1 | * | 1/2003 | Arimilli .............. | G06F 12/0862 711/146 |
| 2008/0092016 A1 | * | 4/2008 | Pawlowski ......... | G06F 11/1076 714/E11.041 |
| 2009/0023414 A1 | * | 1/2009 | Zimmer ................ | H04W 88/06 455/323 |
| 2009/0172690 A1 | * | 7/2009 | Zimmer .................... | G06F 9/50 718/104 |

(Continued)

FOREIGN PATENT DOCUMENTS

WO    2019118096 A1    6/2019

*Primary Examiner* — Paul R. Myers
(74) *Attorney, Agent, or Firm* — Compass IP Law PC

(57) ABSTRACT

Examples include techniques to reduce memory power consumption during a system idle state. Cores of a single socket multi-core processor may be mapped to different virtual non-uniform memory architecture (NUMA) nodes and a dynamic random access memory (DRAM) may be partitioned into multiple segments that are capable of having self-refresh operations separately deactivated or activated. Different segments from among the multiple segments of DRAM may be mapped to the virtual NUMA nodes to allow for a mechanism to cause memory requests for pinned or locked pages of data to be directed to a given virtual NUMA node.

16 Claims, 10 Drawing Sheets

System 100

(56) References Cited

U.S. PATENT DOCUMENTS

| | | | |
|---|---|---|---|
| 2011/0162062 A1* | 6/2011 | Kumar | G06F 21/10 726/15 |
| 2012/0072906 A1* | 3/2012 | Tsirkin | G06F 12/1081 718/1 |
| 2012/0102270 A1* | 4/2012 | Chishti | G06F 12/126 711/E12.001 |
| 2015/0134888 A1* | 5/2015 | Kimberly | G11C 16/3418 711/103 |
| 2016/0188464 A1* | 6/2016 | Bar-Or | G06F 12/0246 711/103 |
| 2017/0123949 A1* | 5/2017 | Pina Coelho | G06F 11/3648 |
| 2019/0043558 A1* | 2/2019 | Suh | G11C 7/1006 |
| 2019/0065087 A1* | 2/2019 | Li | G06F 3/0625 |
| 2021/0073125 A1* | 3/2021 | Duluk, Jr. | G06F 12/0646 |
| 2021/0224213 A1* | 7/2021 | Raj | G06F 12/0238 |
| 2022/0058137 A1* | 2/2022 | Xu | G06F 13/4221 |
| 2022/0262427 A1* | 8/2022 | Krishnakumar | G11C 11/40622 |
| 2023/0297421 A1* | 9/2023 | Cowperthwaite | G06F 9/5055 718/102 |

\* cited by examiner

800

MAP A FIRST PORTION OF CORES OF A SINGLE SOCKET MULTI-CORE PROCESSOR TO A FIRST VIRTUAL NUMA NODE
802

MAP A SECOND PORTION OF THE CORES TO A SECOND VIRTUAL NUMA NODE, THE SECOND PORTION OF CORES TO NOT INCLUDE ANY CORES INCLUDED IN THE FIRST PORTION OF CORES
804

PARTITION A DYNAMIC RANDOM ACCESS MEMORY (DRAM) DEVICE INTO MULTIPLE SEGMENTS, EACH SEGMENT CAPABLE OF HAVING SELF-REFRESH OPERATIONS SEPARATELY DEACTIVATED OR ACTIVATED
806

MAP AT LEAST ONE SEGMENT FROM AMONG THE MULTIPLE SEGMENTS TO A FIRST VIRTUAL LOCAL MEMORY OF THE FIRST VIRTUAL NUMA NODE
808

MAP REMAINING SEGMENTS FROM AMONG THE MULTIPLE SEGMENTS TO A SECOND VIRTUAL LOCAL MEMORY OF THE SECOND VIRTUAL NUMA NODE
810

CAUSE A MEMORY REQUEST TO ALLOCATE MEMORY FOR A PINNED OR A LOCKED PAGE OF DATA TO BE DIRECTED TO THE FIRST VIRTUAL NUMA NODE
812

*FIG. 8*

Storage Medium 900

*Computer Executable Instructions for 800*

*FIG. 9*

TECHNIQUES TO REDUCE MEMORY POWER CONSUMPTION DURING A SYSTEM IDLE STATE

TECHNICAL FIELD

Examples described herein are generally related to reduce power consumption during a system idle state.

BACKGROUND

Client platforms such as laptops, notebooks, and Chromebooks use either double data rate (DDR) or low power DDR (LPDDR) based Dynamic Random-Access Memory (DRAM) technology for system memory. Recent trends in client platforms show that memory is growing in bit density which in turns means higher capacity, for example, system memory supported in laptops are ranging between 8 GB and 64 GB.

During standby states such as Windows® Modern standby, Chrome® Lucid Sleep and S3, currently, the lowest power mode the DRAM memory enters is self-refresh. Self-refresh means that the capacitance on the memory must be supplied with power periodically, such that the data is retained. This contributes to higher power consumption. The higher the memory capacity, the higher the self-refresh power. The impact of memory power is significant when a client platform is in low power standby states that causes other platform components like system-on-chip (SoC), devices, etc. to consume relatively little power compared to power consumed by system memory.

Currently, the memory power consumption (especially DDR memory) is high in client platform standby power states (e.g., about 20-40% of client platform power). The higher power associated with keeping memory in self-refresh has significant impact on battery drain in laptops and has an impact on meeting energy regulations which are becoming increasingly more stringent for some types of desktops.

BRIEF DESCRIPTION OF THE DRAWINGS

FIG. 8 illustrates an example third logic flow.
FIG. 9 illustrates an example of a storage medium.

DETAILED DESCRIPTION

Figure 1:
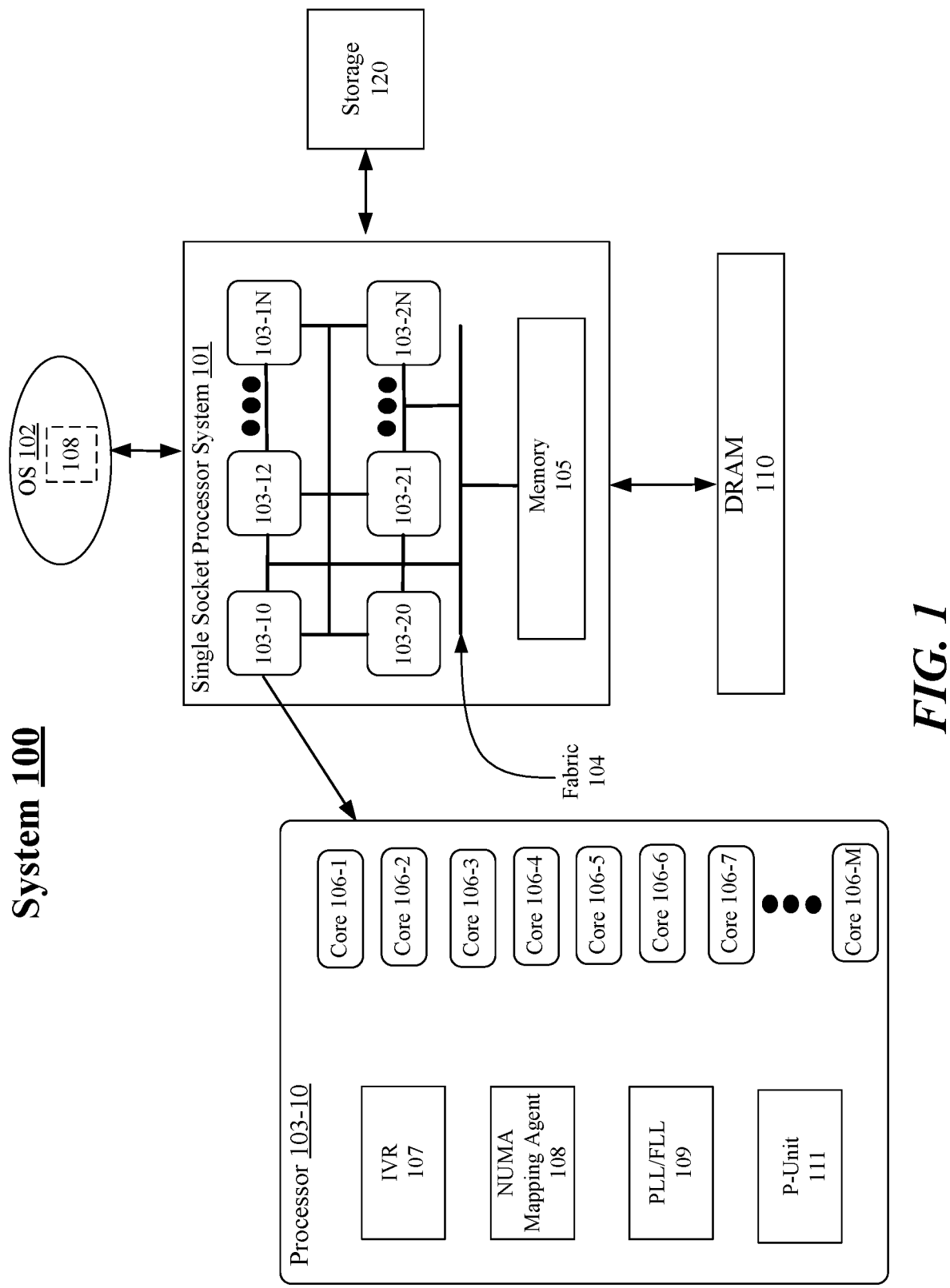
FIG. 1 illustrates an example first system.

In some examples, different kinds of pages may be hosted by an operating system (OS). Amongst these different kinds of pages are pinned/locked pages. Locked pages are typically used to always be physically present in the system's random accesses memory (RAM) (e.g., hereinafter referred to as "system memory"). Pinned pages are typically used such that pinned pages are always present in a specific address location of the system memory. Devices utilizing system memory may request locked or pinned pages via direct memory access (DMA). Also, the OS and other software may also keep certain sections of their code in locked pages for performance purposes. When pages requested by an OS or software are not physically present in system memory, the system causes a page fault which impacts performance. When pages used by devices for DMA are not in memory, these can cause memory corruption, device errors and failures. In some examples, locked pages are scattered across multiple system memory regions and or physically stored to multiple DRAM devices or chips.

During a traditional suspend-to-RAM type of operation, the pinned and locked pages are retained in a dynamic random-access memory (DRAM) along with other data. Retaining the pages in the DRAM incurs power due to the DRAM self-refresh operation. During traditional suspend-to-disk operation, the entire contents of the DRAM are moved to a slower storage disk. The slower storage disk does not incur the DRAM self-refresh power, but the system is slow to wake while all the contents of the DRAM are restored from the slower storage disk. To find a solution for both lower self-refresh power of the DRAM and lower system wake times, the pinned and locked pages in the DRAM can be moved to one segment (e.g., maintained in one or more DRAM chips) of the system memory which would be self-refreshed. Since the movement of the pinned and locked pages is from DRAM to DRAM the, system wake latency would see a significant improvement over suspend-to-disk.

Joint Electron Device Engineering Counsel (JEDEC) memory standard supports memory power management features such as Maximum Power Save mode (MPSM) and Partial array self-refresh (PASR), where self-refresh to portions of memory such as ranks, and banks can be turned off. However, the standard does not provide any suitable implementation of such features. Further, issues mentioned above related to locked/pinned pages spread among multiple memory devices may inhibit or even prohibit the shutting down of portions of memory. This inhibition/prohibition of shutting down portions of memory may result in higher than desired power consumption in a system idle power state. For example, in an ACPI S3 standby power state entire system-on-chip (SoC) power is approximately 5 mW and platform power are approximately 270 mW. Memory consumes significantly high power. For instance, 16 GB DDR5 in self-refresh consumes about 160 mW which is about 60% of the platform power consumption. Likewise 16 GB LPDDR5 in self-refresh consumes about 22 mW. The power savings by turning off the self-refresh power for 16 GB DDR5, keeping one segment in self-refresh, is about 60 mW savings. The power savings by turning off the self-refresh power for 16 GB LPDDR5, keeping one segment in self-refresh is about 8 mW savings. If any more than the one segment needs to stay in self-refresh, power savings will be reduced.

According to some examples, solutions implemented by a Chrome® OS or a Linux OS use of a concept of setting up various types of zones in system memory to include a "zone movable", a "zone normal" and a "zone DMA". Zone normal holds all pinned pages, zone DMA holds DMA pages and zone movable holds pageable pages. When a system using these zones triggers/enters PASR, memory devices with addresses mapped to the zone normal and zone DMA are maintained in a self-refresh and memory devices with addresses mapped to zone moveable are turned off. This solution may work for Chrome® OS or a Linux OS but does not work for Windows® OS for various reasons that adds an unacceptable level of complexity to map system memory to include these types of zones. Hence, Windows® OS memory managers lack the concept of these zones.

In some examples, another solution may include use of a mechanism where the locked/pinned pages are saved and restored by a hardware accelerator which is transparent to the OS. For these examples, the addition of a hardware accelerator to a lower cost client platform may add an unacceptable level of complexity that exceeds benefits of using the hardware accelerator to reduce power consumption and increase exit times from a standby state. It is with respect to these challenges that the examples described herein are needed.

FIG. 1 illustrates an example system 100. In some examples, as shown in FIG. 1, system 100 includes a single socket processor system 101 coupled to an operating system (OS) 102, a DRAM 110 that is arranged to provide system memory and a storage 120 that is arranged to provide persistent/non-volatile storage. Also, as shown in FIG. 1, in some examples, single socket processor system 101 includes one or more processors 103 (individually labeled as processors 103-10 through 103-1N, and 103-20 through 103-2N, where 'N' is a number), fabric 104 connecting processor 103, and a memory 105.

According to some examples, each processor 103 is a die, dielet, or chiplet. Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. In some examples, dies are of the same size and functionality i.e., symmetric cores. However, dies can also be asymmetric. For example, some dies have different size and/or function than other dies. Each processor 103 may also be a dielet or chiplet. Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets.

In some examples, fabric 104 may be a collection of interconnects or a single interconnect that allows the various dies to communicate with one another. Here the term "fabric" generally refers to communication mechanism having a known set of sources, destinations, routing rules, topology, and other properties. The sources and destinations may be any type of data handling functional unit such as, but not limited to, power management units or mapping agents. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

According to some examples, each processor 103 may include a number of processor cores. One such example is illustrated with reference to processor 103-10. In this example, processor 103-10 includes a plurality of processor cores 106-1 through 106-M, where M is a number. For the sake of simplicity, a processor core is referred by the general label 106. Here, the term "processor core" generally refers to an independent execution unit that can run one program thread at a time in parallel with other cores. In some examples, all processor cores are of the same size and functionality i.e., symmetric cores. However, processor cores can also be asymmetric. For example, some processor cores may have different sizes and/or functions than other processor cores. A processor core may be a virtual processor core or a physical processor core. Processor 103-10 may include an integrated voltage regulator (IVR) 107, a locked loop (PLL) and/or frequency locked loop (FLL) 109 and/or a power control unit (P-unit) 111. The various blocks of processor 103-10 may be coupled via an interface or fabric.

In some examples, as described more below, cores 106 of processor 103 may be partitioned or mapped by a non-uniform mapping architecture (NUMA) mapping agent 108 into a plurality of virtual NUMA nodes to facilitate directing memory requests associated with pinned/locked pages of data to a portion of system memory (e.g., segment(s)) maintained in DRAM 110). As shown in FIG. 1, NUMA mapping agent 108 may be included in processor 103-10 or may be an agent that operates as part of OS 102 (e.g., depicted by dashed-line box in FIG. 1). For these examples, partitioned or mapped cores 106 of processor 103-10 included in a single socket processor system 101 are deemed as "virtual NUMA nodes" as a typical implementation of NUMA includes a multi-socketed processor system. A NUMA multi-socketed processor system has each processor in its respective socket being directly coupled with its own local memory via a local memory bus. Processors from each socket of the NUMA multi-socketed processor system may be connected to each other via a fabric or socket-to-socket interconnect. NUMA multi-socketed processors access their own local memory over their respective local memory buses and may also be able to access other processor's local memory over the fabric or socket-to-socket interconnect. Client computing platforms typically include single-socket processors and therefore NUMA is generally not used in client computing platforms. A Windows® OS, such as Windows® 10, may allow for a creation of processor groups, but only if a number of logical processors and/or cores of a processor exceeds 64. Relatively few, if any, client computing platforms have processor systems that exceed 64 logical processors and/or cores.

According to some examples where NUMA mapping agent 108 is included on processor 103-10, NUMA mapping agent 108 may be coupled to OS 102 via an interface. Also, in P-unit 111 may similarly be coupled to OS 102 via an interface. As used herein, the term "interface" generally refers to software and/or hardware at processor 103-10 used to communicate with an interconnect. An interface may include logic and I/O driver/receiver to send and receive data over the interconnect or one or more wires.

In some examples, each processor 103 is coupled to a power supply via a voltage regulator. The voltage regulator may be internal to single socket processor system 101 (e.g., on the package of single socket processor system 101) or external to single socket processor system 101. In some examples, each processor 103 includes IVR 107 that receives a primary regulated voltage from the voltage regulator of single socket processor system 101 and generates an operating voltage for agents, logic and/or features of processor 103. The agents of processor 103 are the various components of processor 103 including cores 106, IVR 107, NUMA mapping agent 108, PLL/FLL 109.

Accordingly, an implementation of IVR 107 may allow for fine-grained control of voltage and thus power and performance of each individual core 106. As such, each core 106 can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. For example, each core 106 may include an IVR to manage power supply to that core where that IVR receives input power supply from the regulated output of IVR 107 or voltage regulator of single socket processor system 101. During power management, a given power domain of one IVR may be powered down or off when the processor core 106 is placed into a certain low power state, while another power domain of another IVR remains active, or fully powered. As such, an IVR may control a certain domain of a logic or processor core 106. Here the term "power domain" generally refers to a logical or physical perimeter that has similar properties (e.g., supply voltage, operating frequency, type of circuits or logic, and/or workload type) and/or is controlled by a particular power agent. For example, a power domain may be a group of logic units or function units that are controlled by a particular power supervisor. A power domain may also be referred to as an Autonomous Perimeter (AP). A power domain can be an entire system-on-chip (SoC) or part of the SoC and is governed by a p-unit.

In some examples, each processor 103 includes its own p-unit 111. P-unit 111 controls the power and/or performance of processor 103. P-unit 111 may control power and/or performance (e.g., IPC, frequency) of each individual core 106. In various examples, p-unit 111 of each processor 103 is coupled via fabric 104. As such, the p-units 111 of each processor 103 communicate with another and OS 102 to determine the optimal power state of single socket processor system 101 by controlling power states of individual cores 106 under their domain.

P-unit 111 may include circuitry including hardware, software and/or firmware to perform power management operations with regard to processor 103. In some embodiments, p-unit 111 provides control information to voltage regulator of processor system 101 via an interface to cause the voltage regulator to generate the appropriate regulated voltage. In some embodiments, p-unit 111 provides control information to IVRs of cores 106 via another interface to control the operating voltage generated (or to cause a corresponding IVR to be disabled in a low power mode). In some embodiments, p-unit 111 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software). In some embodiments, p-unit 111 is implemented as a microcontroller. The microcontroller can be an embedded microcontroller which is a dedicated controller or as a general-purpose controller. In some embodiments, p-unit 111 is implemented as a control logic configured to execute its own dedicated power management code, here referred to as pCode. In some embodiments, power management operations to be performed by p-unit 111 may be implemented externally to a processor 103, such as by way of a separate power management integrated circuit (PMIC) or other component external to processor system 101. In yet other embodiments, power management operations to be performed by p-unit 111 may be implemented within BIOS or other system software. In some embodiments, p-unit 111 of a processor 103 may assume a role of a supervisor or supervisee.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnects. In examples where a die has one p-unit, a supervisor (Svor) p-unit may also be referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit In various embodiments, p-unit 111 executes a firmware (referred to as pCode) that communicates with OS 102. In various embodiments, each processor 103 includes a PLL or FLL 109 that generates clock from p-unit 111 and input clock (or reference clock) for each core 106. Cores 106 may include or be associated with independent clock generation circuitry such as one or more PLLs to control operating frequency of each core 106 independently.

According to some examples, storage 120 may include one or more types of non-volatile memory. The one or more types of non-volatile memory may include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Figure 2:
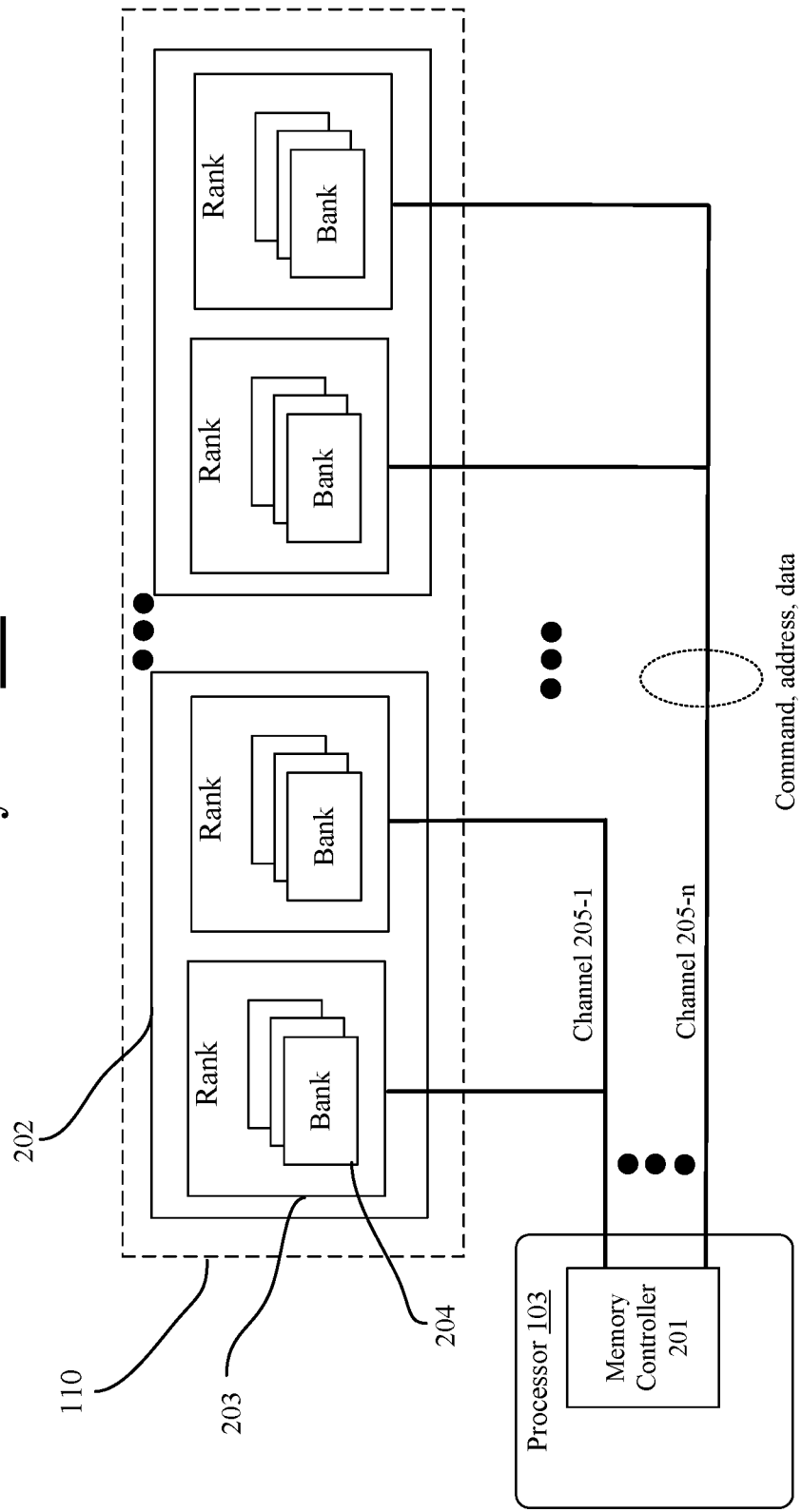
FIG. 2 illustrates an example second system.

FIG. 2 illustrates an example system 200. In some examples, as shown in FIG. 2, system 200 includes a memory controller 201, which may be part of processor 130 or outside of processor 103. For these examples, DRAM memory 110 that was shown in FIG. 1 and may be arranged to serve as system memory processor 103 is partitioned into multiple modules 202. Modules 202, in some examples, may be arranged as dual in-line memory modules (DIMMs). Each module 202 may include one or more ranks 203. Each rank may include memory organized as multiple banks 204. An interface between memory controller 201 and the ranks 203 is via any suitable memory interface such as double data rate interface. Channels 205-1 through 205-n carry command, address, and data signals to/from the DRAM 110 to memory controller 201. When DRAM 110 is a DRAM accessible by DDR interface, the memory is organized into rows and columns. These rows and columns are grouped together to form a bank 204. Groups of banks 204 form rank 203.

As mentioned above, there are two JEDEC standard features to save DRAM power when the memory is in self refresh-partial array self-refresh (PASR) and maximum power saving mode (MPSM). PASR allows suspension of the self-refresh operation on selected banks to save power during a system idle state and MPSM allows suspension of an entire rank to save power during a system idle state. PASR and MPSM features, for example, may be available in LPDDR5 DRAMs and in DDR5 DRAMs.

When using either the PASR or MPSM feature by turning off the self-refresh operation in in a portion of DRAM 110, there will be a loss of data in the banks and/or ranks of DRAM 110 included in the portion that will not be refreshed. To prevent loss of the data, pages associated with the data will need to be moved from the non-refreshed portion of DRAM 110 to a persistent/non-volatile storage (NVM) or consolidate the pages associated with the data in another portion of DRAM 110 that will continue to be refreshed following a PASR/MPSM trigger event (e.g., entering an system idle state). One goal is to maintain merely data associated with critical pages (e.g., pinned/locked pages) in the refreshed portion of DRAM 110 following a PASR/MPSM trigger event. The data associated with the critical pages may then be used for fast system exit from an idle state while still saving power by possibly reducing the number of banks and/or ranks that will need to be refreshed to prevent loss of data associated with the critical pages.

Figure 3:
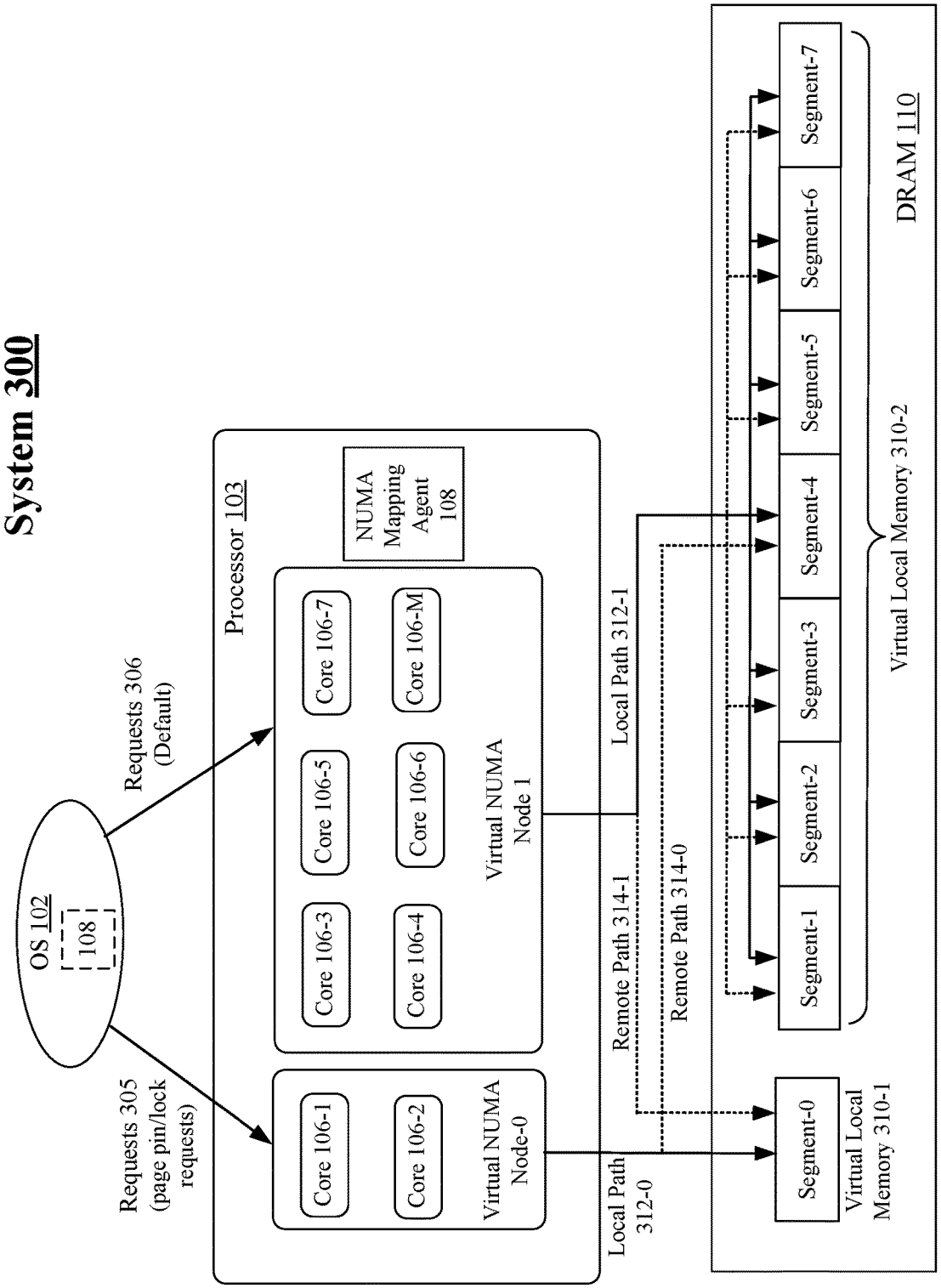
FIG. 3 illustrates an example third system.

FIG. 3 illustrates an example system 300. In some examples, as shown in FIG. 3, system 300 shows an example of cores 106 of processor 103 partitioned and mapped to separate virtual NUMA nodes that are then arranged to access partitioned segments of DRAM 110. For these examples, cores 106-1 and 106-2 are mapped to a virtual NUMA Node-0 and cores 106-3 to 106-M are mapped to a virtual NUMA Node-1. Examples are not limited to 2 virtual NUMA nodes and/or are not limited to 2 or more cores in a virtual NUMA node (e.g., a single core may be mapped to a virtual NUMA node). Also as shown in FIG. 3, virtual NUMA Node-0 has a local path 312-0 to access virtual local memory 310-1 that includes segment-0 and virtual NUMA Node-1 has a local path 312-1 to access virtual local memory 310-2 that includes segment-1 to segment-7. Also, as shown in FIG. 3, virtual NUMA node-0 has a remote path 314-0 to access virtual local memory 310-2 and NUMA node-1 has For these examples, segment-0 to segment-7 may represent separate modules, ranks or banks of DRAM 110 that may be capable of having their respective self-refresh operations turned off (e.g., selectively activated or deactivated). Examples are not limited to the partitioned segments of DRAM 110 shown in FIG. 3. Other combinations that may include more segments in virtual memory 310-1 and less segments in virtual memory 310-2 are contemplated.

Figure 4:
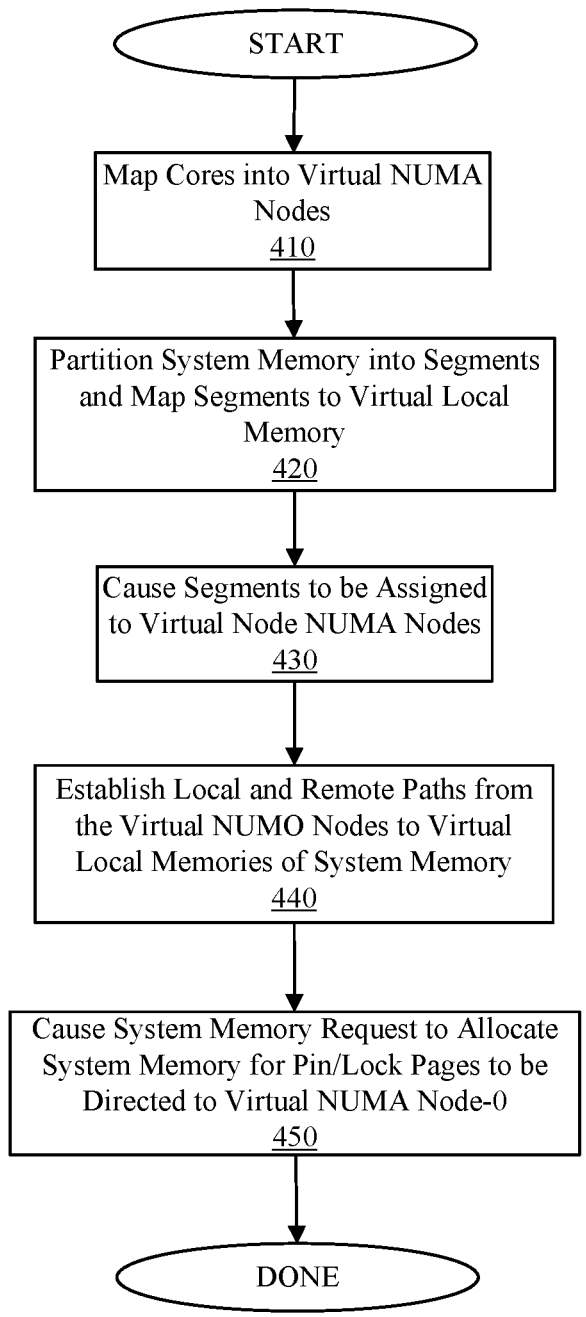
FIG. 4 illustrates an example first logic flow.

FIG. 4 illustrates an example logic flow 400. In some examples, logic flow 400 may be implemented by logic and/or features of NUMA mapping agent 108 that may map cores 106-0 to 106-M to virtual NUMA nodes as shown in FIG. 3. Also, the logic and/or features of NUMA mapping agent 108 may establish local and remote memory paths between virtual NUMA nodes and portions of a segmented DRAM 110 as shown in FIG. 3. The segmented DRAM 110 to serve as system memory for a system that includes processor 103 as shown in FIG. 1. Examples disclosed herein are not limited to just logic and/or features of NUMA mapping agent 108 to map cores to virtual NUMA nodes and establish local and remote memory paths. This disclosure contemplates that other agents, units or controllers of a system may implement at least portions of logic flow 400.

Logic flow 400 begins at block 410 where logic and/or features of NUMA mapping agent 108 may partition or map cores 106 of processor 103 into virtual NUMA nodes. According to some examples, as shown in FIG. 3, cores 106-1 and 106-2 are mapped to virtual NUMA Node-0 and cores 106-3 to 106-M are mapped to virtual NUMA Node-1.

Moving from block 410 to block 420, logic and/or features of NUMA mapping agent 108 may cause a partition of system memory into 8 segments and then separate portions of the 8 segments to be separately map to different virtual local memories. As mentioned above, DRAM 110 is arranged to be system memory for a system that includes processor 103. According to some examples, the partitioned system memory includes segment-0 of DRAM 110 being partitioned separate from segment-1 to segment-7. The logic and/or features of NUMA mapping agent 108 may cause segment-0 to be mapped to virtual local memory 310-1 and cause segment-1 to segment-7 to be mapped to virtual local memory 310-2.

Moving from block 420 to block 430, logic and/or features of NUMA mapping agent 108 may then map virtual local memory 310-1 to virtual NUMA Node-0 to cause segment-0 to be assigned to virtual NUMA Node-0 and map virtual local memory 310-2 to virtual NUMA node-1 to cause segment-1 to segment-7 to be assigned to virtual NUMA Node-1.

Moving from block 430 to block 440, logic and/or features of NUMA mapping agent 108 may cause local and remote paths to be established from virtual NUMA Node-0 and Node-1 to respective virtual local memories 310-1 and 310-2. In some examples, as shown in FIG. 3, local path 312-0 may be established between virtual NUMA Node-0 and virtual local memory 310-1 and local path 312-1 may be established between virtual NUMA Node-1 and virtual local memory 310-2.

Moving from block 440 to block 450, logic and/or features of NUMA mapping agent 108 may cause system memory requests (e.g., from applications or drivers) that include hints/flags for pinning or locking pages to be directed to virtual NUMA Node-0. According to some examples, as described more below, causing the system memory requests having these hints/flags to be directed to virtual NUMA Node-0 results in data stored to this allocated system memory to be stored to segment-0 of DRAM 110. Segment-0 may be arranged to keep self-refresh operations active/on during a system idle state and segment-1 to segment-7 are arranged to turn off/deactivate self-refresh operations during the system idle state. When PASR/MPSM is triggered the non-critical data from segment1-7 can be moved to storage. Since the pinned/locked pages will already be in segment-0 they don't need to be moved and will result in power saving as well as reduction of latency in entering and exiting PASR/MPSM.

Figure 5:
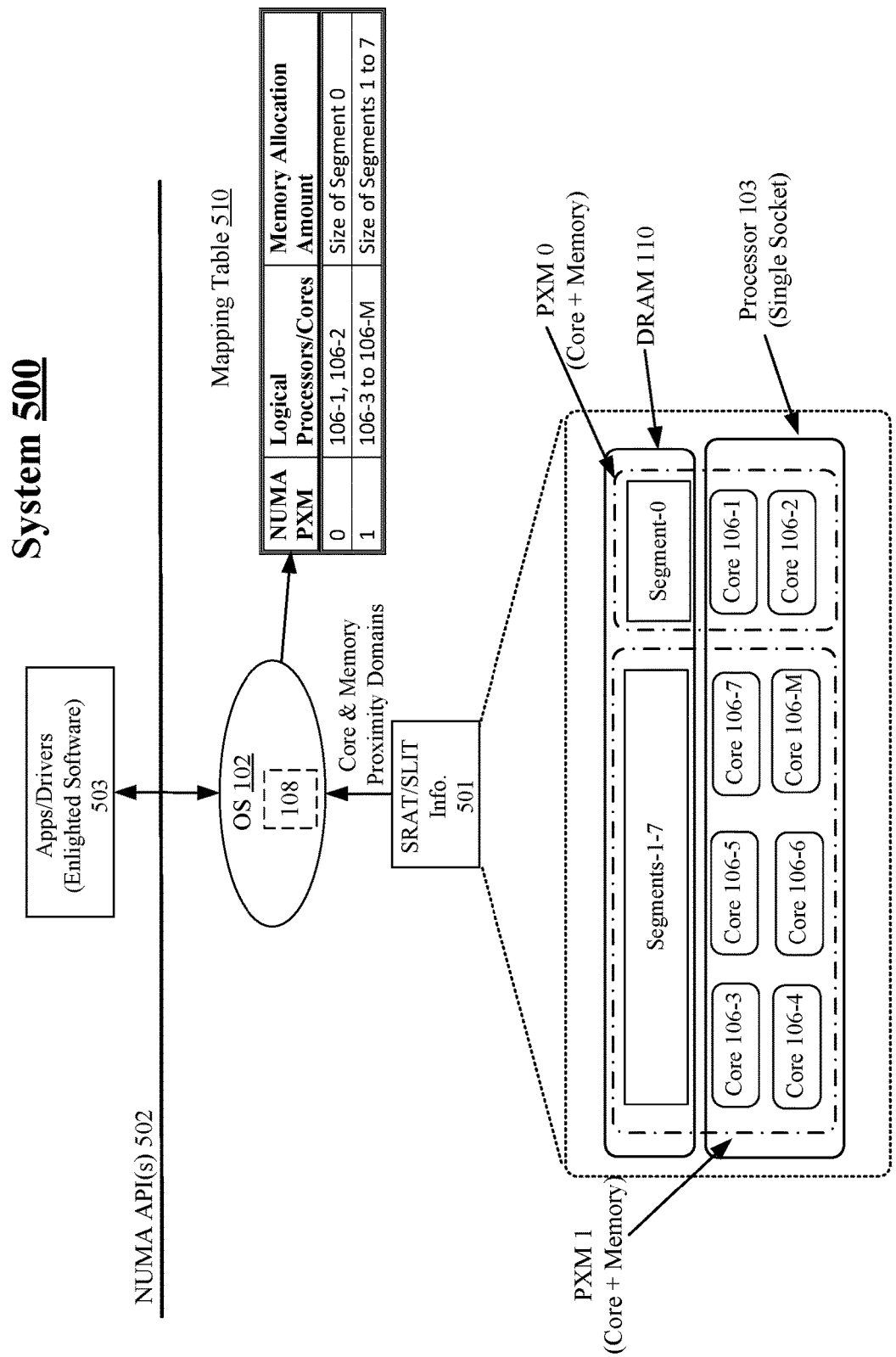
FIG. 5 illustrates an example fourth system.

FIG. 5 illustrates an example system 500. In some examples, as shown in FIG. 5, system 500 shows an example of how configuration information of cores 106-1 to 106-M of processor 103 into virtual NUMA nodes mapped to segments of DRAM 110 may be communicated to OS 102 and how applications/drivers 503 (enlightened software) are executed, at least in part, by processor 103 may utilize one or more NUMA application programming interfaces (API(s)) to query that configuration (as described more below). For these examples, ACPI methods such as use of a static resource affinity table (SRAT) and/or a system locality information table (SLIT) that include the configuration information may be used to provide/communicate configuration information to OS 102. For these examples SRAT/SLIT information 501 may be generated in accordance with the ACPI specification, Version 6.4, published in January 2021 by the Unified Extensible Firmware Interface Forum (UEFI). FIG. 5 only shows basic information for SRAT/SLIT information 501 to show that a proximity domain (PXM) 1 includes segments-1-7 of DRAM 110 and cores 106-3 to 106-M of processor 103 and PXM 2 includes segment-0 of DRAM 110 and cores 106-1 and 106-2 of processor 103. SRAT/SLIT information 501 may also indicate a memory allocation amount for each PXM (e.g., 2 GB for PXM 0 and 14 GB for PXM 1). Examples are not limited to what is shown in FIG. 5 for SRAT/SLIT information 501.

According to some examples, OS 102 may build a mapping table 510 based on SRAT/SLIT information 501 to determine PXM 1 and PXM 0 characteristics. For example, table 510 for NUMA PXM 0 indicates cores 106-1 and 106-2 and a size of segment-0 and for NUMA PXM 1 indicates cores 106-3 to 106-M and a size of segment-1 to segment-7. For these examples and as described more below, OS 102 may enable applications and/or drivers (enlightened software) a mechanism to query NUMA information included in mapping table 510 via NUMA API(s) 502 and then the applications or drives may give hints/flags to OS 102 that these applications and/or drivers intend to pin/lock pages in PXM 0 that includes segment-0 when they request a system memory allocation. The applications and/or drivers may also just indicate that a target of the request is via virtual NUMA Node-0 to cause pinned/locked pages to be stored to segment-0 knowing that this segment of DRAM 110 will not have self-refresh operations turned off during an idle system state.

Figure 6:
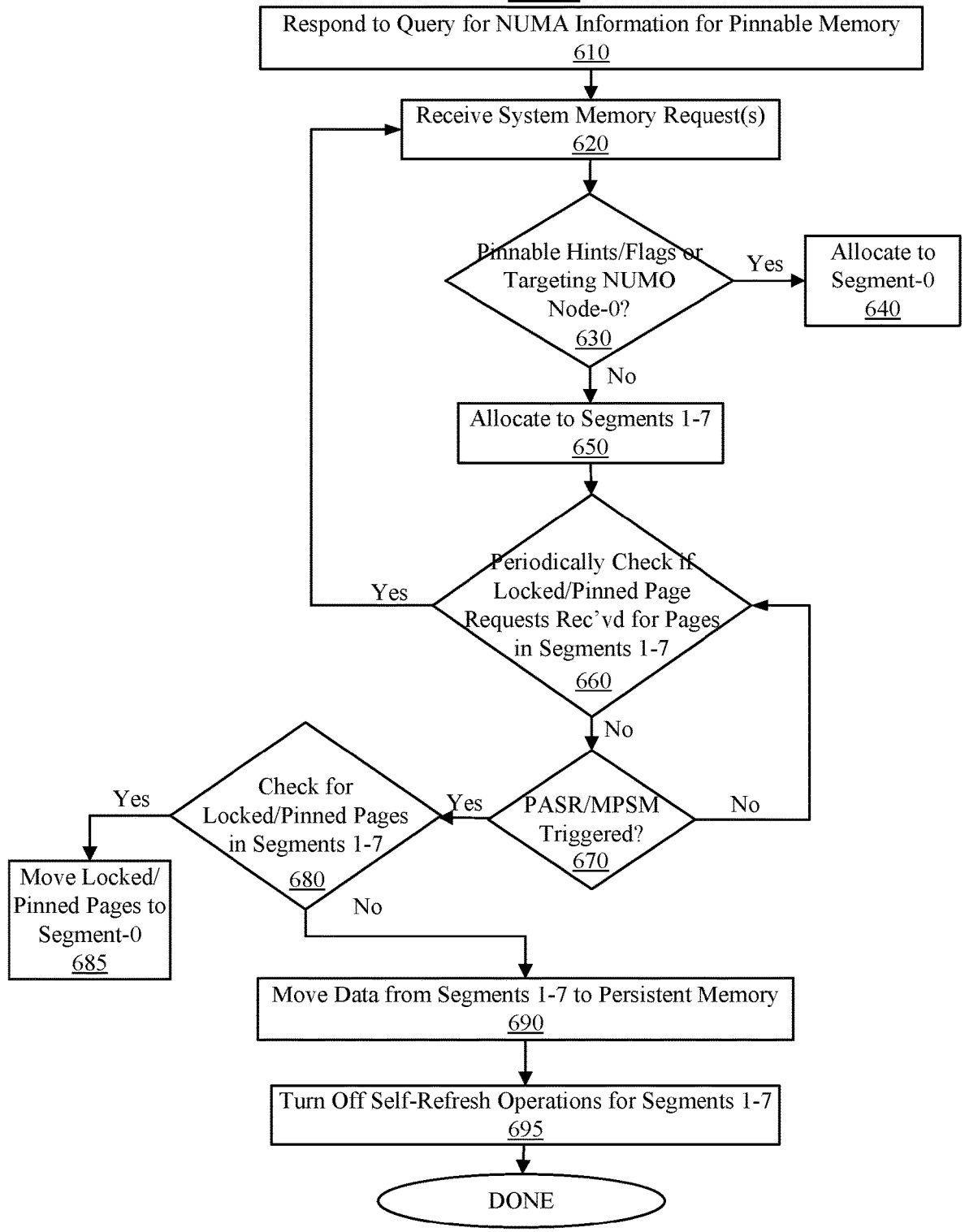
FIG. 6 illustrates an example second logic flow.

FIG. 6 illustrates an example logic flow 600. In some examples, logic flow 600 may be implemented by logic and/or features of NUMA mapping agent 108 located at OS 102 as shown in FIGS. 1, 3 and 5. Also, system 500 as shown in FIG. 5 that indicates NUMA PXMs 0 and 1 in table 510 and depicts a utilization of NUMA API(s) 502 by application or drivers 503 may be used to describe logic flow 600. Examples disclosed herein are not limited to just logic and/or features of NUMA mapping agent 108 and/or OS 102 as shown or described for FIG. 1, 3 or 5. This disclosure contemplates that other agents, units or controllers of a system may implement at least portions of logic flow 600.

Logic flow 600 begins at block 610 where logic and/or features of NUMA agent 108 and/or OS 102 may respond to a query for NUMA information for pinnable memory. According to some examples, the query may be received from applications or drivers 503 that are aware of ways to use NUMA API(s) 502 to query for NUMA information. As mentioned previously, these NUMA API aware applications or drivers may be deemed as enlightened software. For these examples, the logic and features of NUMA agent 108 and/or OS 102 may provide the information included in mapping table 510 to indicate NUMA PXM 0 that includes segment-0 assigned to virtual NUMA Node-0 is allocated for use as pinnable memory (e.g., self-refresh operations for segment-0 are not stopped during an idle state).

Moving from block 610 to block 620, logic and/or features of NUMA agent 108 and/or OS 102 may receive one or more system memory requests for an allocation of system memory.

Moving from block 620 to decision block 630, logic and/or features of NUMA agent 108 and/or OS 102 may determine whether the system memory request includes pinnable hints/flags or targets NUMA Node-0. In some examples, enlightened software that is aware that a segment of DRAM 110 has been allocated for pinnable memory may indicate an intention to pin/lock memory for a duration of time by providing hints/flags. Alternatively and/or in addition to hints/flags, the enlightened software may indicate in the request that virtual NUMO Node-0 is targeted to be used to access the requested allocation of system memory (e.g., to execute at least a portion of a workload for the application). Thus, by targeting NUMA Node-0 that is assigned to segment-0, the enlightened software knows that the system memory request will be for an allocation to a pinnable memory of DRAM 110. For these examples, if the system memory request includes pinnable hints/flags or targets NUMA Node-0, logic flow 600 moves to block 640. Otherwise, logic flow 600 moves to block 650.

Moving from decision block 630 to block 640, logic and/or features of NUMA agent 108 and/or OS 102 may allocate system memory responsive to the system memory requests not having hints/flags or targeting virtual NUMA Node-0 to memory addresses associated with one or more segments 1-7 of DRAM 110.

Moving from decision block 630 to block 650, logic and/or features of NUMA agent 108 and/or OS 102 may allocate system memory to segments 1-7 responsive to the system memory request not having hints/flags or targeting virtual NUMA Node-0 to memory addresses associated with segment-0 of DRAM 110.

Moving from block 650 to decision block 660, logic and/or features of NUMA agent 108 and/or OS 102 may check if locked/pinned page request have been received for page in segments 1-7 of DRAM 110. In some examples, requests for unenlightened locked/pinned pages may be related to applications or drivers not aware of or capable of utilizing NUMA API(s) 502. Hence, system memory requests from these types of unenlightened software may cause pinned/locked pages to be allocated to segments 1-7 instead of segment-0. For these examples, periodically for pinned/locked page requests may minimize an amount of data that needs to be moved to segment-0 when transitioning to an idle state. In some examples, if requests for unenlightened locked/pinned pages are detected, logic flow 600 moves to block 620. Otherwise, logic flow 600 moves to decision block 670.

Moving from decision block 660 to decision block 670, logic and/or features of NUMA agent 108 and/or OS 102 may determine whether a PASR or MPSM is triggered that indicates a transition to an idle state. If a PASR or MPSM was trigged, logic flow 600 moves to decision block 680. Otherwise, logic flow 600 moves back to decision block 660.

Moving from decision block 670 to decision block 680, logic and/or features of NUMA agent 108 and/or OS 102 may determine if any locked/pinned pages are located in segments 1-7. If locked/pinned pages are located in segments 1-7, logic flow 600 moves to block 685. Otherwise, logic flow 600 moves to block 690.

Moving from decision block 680 to block 685, logic and/or features of NUMA agent 108 and/or OS 102 may move the unenlightened locked/pinned pages to segment-0 to prevent possible loss of data associated with these pages.

Moving from decision block 680 or from block 690, logic and/or features of NUMA agent 108 and/or OS 102 may move data in segments 1-7 to a persistent memory (e.g., storage 120).

Moving from block 690 to block 685, logic and/or features of NUMA agent 108 and/or OS 102 may cause self-refresh operations to be turned off or deactivated for segments 1-7.

Figure 7:
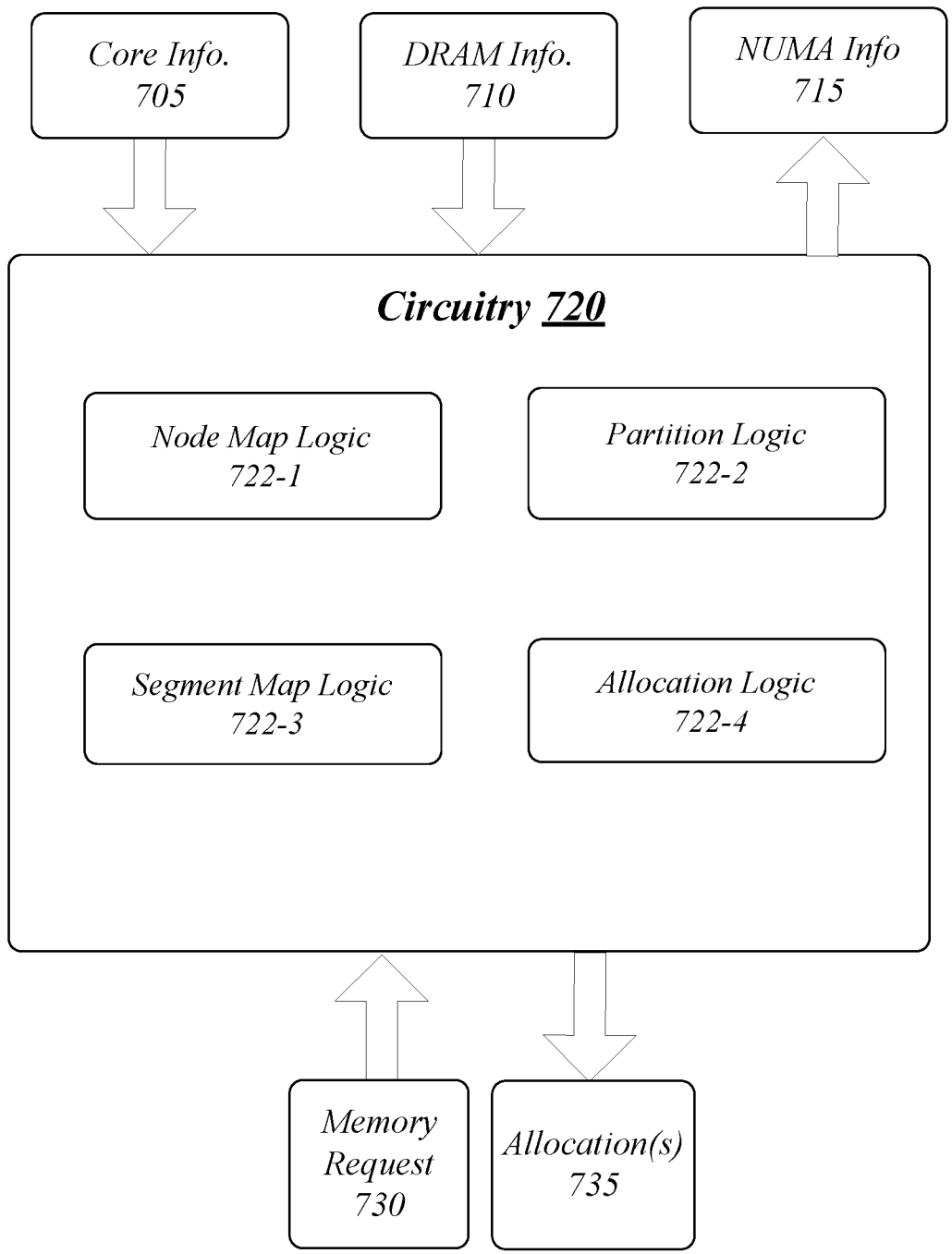
FIG. 7 illustrates an example apparatus.

FIG. 7 illustrates an example apparatus 700. Although apparatus 700 shown in FIG. 7 has a limited number of elements in a certain topology, it may be appreciated that the apparatus 700 may include more or less elements in alternate topologies as desired for a given implementation.

According to some examples, apparatus 700 may be supported by circuitry 720 and apparatus 700 may be located as part of a single socket multi-core processor system and/or as part of an operating system executed by one or more cores of the single socket multi-core processor system(e.g., cores 106 of single socket processor system 101). Circuitry 720 may be arranged to execute one or more software or firmware implemented logic, components, agents, or modules 722-a (e.g., implemented, at least in part, by a controller of a memory device). It is worthy to note that "a" and "b" and "c" and similar designators as used herein are intended to be variables representing any positive integer. Thus, for example, if an implementation sets a value for a=4, then a complete set of software or firmware for logic, components, agents, or modules 722-a may include logic 722-1, 722-2, 722-3 or 722-4. Also, at least a portion of "logic" may be software/firmware stored in computer-readable media, or may be implemented, at least in part in hardware and although the logic is shown in FIG. 7 as discrete boxes, this does not limit logic to storage in distinct computer-readable media components (e.g., a separate memory, etc.) or implementation by distinct hardware components (e.g., separate processors, processor circuits, cores, ASICs or FPGAs).

In some examples, apparatus 700 may include a node map logic 722-1. Node map logic 722-1 may be a logic and/or feature executed by circuitry 720 to map a first portion of cores of a single socket multi-core processor to a first virtual NUMA node and map a second portion of cores of the single socket multi-core processor to a second virtual NUMA node. For these examples, the second portion of cores does not include any cores included in the first portion of cores. Node map logic 722-1 may utilize information included in core info. 705 to determine how to map the cores of the single socket multi-core processor (e.g., total number and types of logical processors/cores).

According to some examples, apparatus 700 may also include a partition logic 722-2. Partition logic 722-2 may be a logic and/or feature executed by circuitry 720 to partition a DRAM device into multiple segments, each segment capable of having self-refresh operations separately deactivated or activated. For these examples, partition logic 722-2 may use information included in DRAM info. 710 to determined how to partition the DRAM into the multiple segments.

In some examples, apparatus 700 may also include a segment map logic 722-3. Segment map logic 722-3 may be a logic and/or feature executed by circuitry 720 to map at least one segment from among the multiple segments to a first virtual local memory of the first virtual NUMA node to cause the at least one segment to be assigned to the first virtual NUMA node. Segment map logic 722-3 may also map remaining segments from among the multiple segments to a second virtual local memory of the second virtual NUMA node to cause the remaining segments to be assigned to the second virtual NUMA node. For these examples, segment map logic 722-3 may provide the NUMA mapping information to an operating system or to an application executed by the single socket multi-core processor via NUMA info. 715.

According to some examples, apparatus 700 may also include an allocation logic 722-4. Allocation logic 722-4 may be a logic and/or feature executed by circuitry 720 to cause a memory request to allocate memory for a pinned or a locked page of data to be directed to the first virtual NUMA node. For these examples, the memory request may be received via memory request 730 and allocation(s) 735 may indicate how the memory was allocated.

FIG. 8 illustrates an example of a logic flow 800. Logic flow 800 may be representative of some or all of the operations executed by one or more logic, features, or devices described herein, such as logic and/or features included in apparatus 700. More particularly, logic flow 800 may be implemented by one or more of node map logic 722-1, partition logic 822-2, segment map logic 822-3 or allocation logic 822-4.

According to some examples, as shown in FIG. 8, logic flow 800 at block 802 may map a first portion of cores of a single socket multi-core processor to a first virtual NUMA node. For these examples, node map logic 722-1 may map the first portion of cores to the first virtual NUMA node.

In some examples, logic flow 800 at block 804 may map a second portion of the cores to a second virtual NUMA node, the second portion of cores to not include any cores included in the first portion of cores. For these examples, node map logic 722-1 may map the second portion of cores to the second virtual NUMA node.

According to some examples, logic flow 800 at block 806 may partition a DRAM device into multiple segments, each segment capable of having self-refresh operations separately deactivated or activated. For these examples, partition logic 722-2 may partition the DRAM device.

According to some examples, logic flow 800 at block 808 may map at least one segment from among the multiple segments to a first virtual local memory of the first virtual NUMA node. For these examples, segment map logic 722-3 maps the at least one segment to the first virtual local memory of the first virtual NUMA node.

In some examples, logic flow 800 at block 810 may map remaining segments from among the multiple segments to a second virtual local memory of the second virtual NUMA node. For these examples segment map logic 722-3 maps the remaining segments to the second virtual local memory of the second virtual NUMA node.

According to some examples, logic flow 800 at block 812 may cause a memory request to allocate memory for a pinned or a locked page of data to be directed to the first virtual NUMA node. For these examples, allocation logic 722-4 may cause the memory request to be directed to the first virtual NUMA node.

The set of logic flows shown in FIGS. 4, 6 and 8 may be representative of example methodologies for performing novel aspects described in this disclosure. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 10:
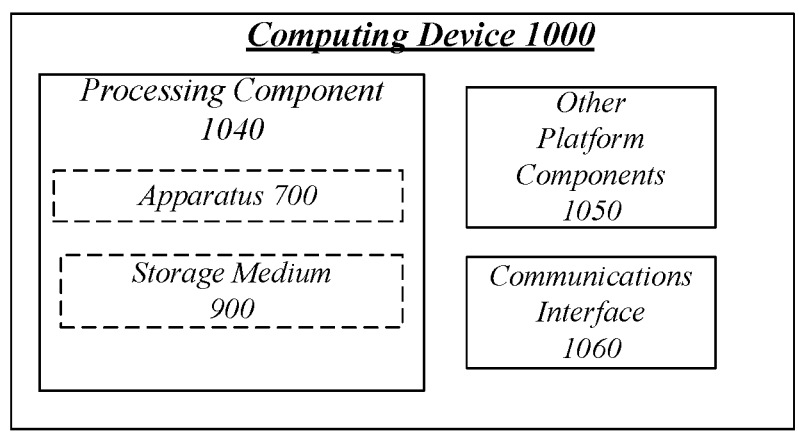
FIG. 10 illustrates an example compute device.

FIG. 9 illustrates an example of a storage medium. As shown in FIG. 10, the storage medium includes a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

FIG. 10 illustrates an example compute device 1000. In some examples, as shown in FIG. 10, compute device 1000 may include a processing component 1040, other platform components 1050 or a communications interface 1060.

According to some examples, processing components 1040 may execute at least some processing operations or logic for apparatus 700 based on instructions included in a storage media that includes storage medium 900. Processing components 1040 may include various hardware elements, software elements, or a combination of both. For these examples, Examples of hardware elements may include devices, logic devices, components, processors, microprocessors, management controllers, companion dice, circuits, processor circuits, circuit elements (e.g., transistors, resistors, capacitors, inductors, and so forth), integrated circuits, ASICs, programmable logic devices (PLDs), digital signal processors (DSPs), FPGAs, memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (APIs), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

According to some examples, processing component 1040 may include an infrastructure processing unit (IPU) or a data processing unit (DPU) or may be utilized by an IPU or a DPU. An xPU may refer at least to an IPU, DPU, graphic processing unit (GPU), general-purpose GPU (GPGPU). An IPU or DPU may include a network interface with one or more programmable or fixed function processors to perform offload of workloads or operations that could have been performed by a CPU. The IPU or DPU can include one or more memory devices (not shown). In some examples, the IPU or DPU can perform virtual switch operations, manage storage transactions (e.g., compression, cryptography, virtualization), and manage operations performed on other IPUs, DPUs, servers, or devices.

In some examples, other platform components 1050 may include common computing elements, memory units (that include system memory), chipsets, controllers, peripherals, interfaces, oscillators, timing devices, video cards, audio cards, multimedia input/output (I/O) components (e.g., digital displays), power supplies, and so forth. Examples of memory units or memory devices included in other platform components 1050 may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur via use of communication protocols or standards described in one or more industry standards (including progenies and variants) such as those associated with the PCIe specification, the NVMe specification or the I3C specification. Network communications may occur via use of communication protocols or standards such those described in one or more Ethernet standards promulgated by the Institute of Electrical and Electronics Engineers (IEEE). For example, one such Ethernet standard promulgated by IEEE may include, but is not limited to, IEEE 802.3-2018, Carrier sense Multiple access with Collision Detection (CSMA/CD) Access Method and Physical Layer Specifications, Published in August 2018 (hereinafter "IEEE 802.3 specification"). Network communication may also occur according to one or more OpenFlow specifications such as the OpenFlow Hardware Abstraction API Specification. Network communications may also occur according to one or more Infiniband Architecture specifications.

Compute device 1000 may be coupled to a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

Functions and/or specific configurations of compute device 1000 described herein, may be included, or omitted in various embodiments of compute device 1000, as suitably desired.

The components and features of compute device 1000 may be implemented using any combination of discrete circuitry, ASICs, logic gates and/or single chip architectures. Further, the features of compute device 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

It should be appreciated that the exemplary compute device 1000 shown in the block diagram of FIG. 10 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within a processor, processor circuit, ASIC, or FPGA which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the processor, processor circuit, ASIC, or FPGA.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The following examples pertain to additional examples of technologies disclosed herein.

Example 1. An example apparatus may include circuitry coupled with a single socket multi-core processor. For this example, the circuitry may map a first portion of cores of the single socket multi-core processor to a first virtual NUMA node and map a second portion of the cores to a second virtual NUMA node. For this example, the second portion of the cores does not include any cores included in the first portion of cores. The circuitry may also partition a DRAM device into multiple segments, each segment capable of having self-refresh operations separately deactivated or activated. The circuitry may also map at least one segment from among the multiple segments to a first virtual local memory of the first virtual NUMA node and map remaining segments from among the multiple segments to a second virtual local memory of the second virtual NUMA node. The circuitry may also cause a memory request to allocate memory for a pinned or a locked page of data to be directed to the first virtual NUMA node.

Example 2. The apparatus of example 1, the memory request may be received from an application to be executed by the single socket multi-core processor. For this example, the circuitry may also cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

Example 3. The apparatus of example 2, the indication in the memory request that the pinned or locked page of data is to be allocated to the at least one segment mapped to the first virtual local memory or based on the memory request targeting the allocation of memory for use by the first virtual NUMA node may be based on the application being capable of using a NUMA API to query an operating system executed by the single socket multi-core processor to determine that the at least one segment is mapped to the first virtual local memory.

Example 4. The apparatus of example 1, the memory request may be received from an application to be executed by the single socket multi-core processor. For this example, the circuitry may cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

Example 5. The apparatus of example 1, the circuitry may also receive an indication that a system that includes the single socket multi-core processor is to enter an idle power state. The circuitry may also determine whether any pinned or locked pages of data have been allocated to the remaining segments mapped to the second virtual local memory. The circuitry may also move pinned or locked pages of data based on the determination to the at least one segment mapped to the first virtual local memory. The circuitry may also move non-pinned or non-locked pages of data to a persistent storage device coupled with the single socket multi-core processor. The circuitry may also turn off self-refresh operations for the remaining segments mapped to the second virtual local memory.

Example 6. An example method may include mapping a first portion of cores of a single socket multi-core processor to a first virtual NUMA node and mapping a second portion of the cores to a second virtual NUMA node. For this example, the second portion of the cores does not include any cores included in the first portion of cores. The method may also include partitioning a DRAM device into multiple segments, each segment capable of having self-refresh operations separately deactivated or activated. The method may also include mapping at least one segment from among the multiple segments to a first virtual local memory of the first virtual NUMA node and mapping remaining segments from among the multiple segments to a second virtual local memory of the second virtual NUMA node. The method may also include causing a memory request to allocate memory for a pinned or a locked page of data to be directed to the first virtual NUMA node.

Example 7. The method of example 6, the memory request may be received from an application to be executed by the single socket multi-core processor. For this example the method may further include causing the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

Example 8. The method of example 7, the indication in the memory request that the pinned or locked page of data is to be allocated to the at least one segment mapped to the first virtual local memory or based on the memory request targeting the allocation of memory for use by the first virtual NUMA node may be based on the application being capable of using a NUMA API to query an operating system executed by the single socket multi-core processor to determine that the at least one segment is mapped to the first virtual local memory.

Example 9. The method of example 6, the memory request may be received from an application to be executed by the single socket multi-core processor. For this example, the method further include causing a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

Example 10. The method of example 6 may also include receiving an indication that a system that includes the single socket multi-core processor is to enter an idle power state. The method may also include determining whether any pinned or locked pages of data have been allocated to the remaining segments mapped to the second virtual local memory. The method may also include moving pinned or locked pages of data based on the determination to the at least one segment mapped to the first virtual local memory. The method may also include moving non-pinned or non-locked pages of data to a persistent storage device coupled with the single socket multi-core processor. The method may also include turning off self-refresh operations for the remaining segments mapped to the second virtual local memory.

Example 11. An example system may include a DRAM device, a single socket multi-core processor coupled with the DRAM device, and an operating system to be executed by the single socket multi-core processor. For this example, the operating system may include logic to map a first portion of cores of the single socket multi-core processor to a first virtual NUMA node and map a second portion of the cores to a second virtual NUMA node. For this example, the second portion of the cores does not include any cores included in the first portion of cores and partition the DRAM device into multiple segments, each segment capable of having self-refresh operations separately deactivated or activated. The logic may also map at least one segment from among the multiple segments to a first virtual local memory of the first virtual NUMA node and map remaining segments from among the multiple segments to a second virtual local memory of the second virtual NUMA node. The logic may also cause a memory request to allocate memory for a pinned or a locked page of data to be directed to the first virtual NUMA node.

Example 12. The system of example 11, the memory request may be received from an application to be executed by the single socket multi-core processor. For this example, the operating system logic may cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

Example 13. The system of example 12, the indication in the memory request that the pinned or locked page of data is to be allocated to the at least one segment mapped to the first virtual local memory or based on the memory request targeting the allocation of memory for use by the first virtual NUMA node may be based on the application being capable of using a NUMA API to query an operating system executed by the single socket multi-core processor to determine that the at least one segment is mapped to the first virtual local memory.

Example 14. The system of example 11, the memory request may be received from an application to be executed by the single socket multi-core processor. For this example, the operating system logic may cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

Example 15. The system of example 11, the operating system logic may also receive an indication that a system that includes the single socket multi-core processor is to enter an idle power state. The logic may also determine whether any pinned or locked pages of data have been allocated to the remaining segments mapped to the second virtual local memory. The logic may also move pinned or locked pages of data based on the determination to the at least one segment mapped to the first virtual local memory. The logic may also move non-pinned or non-locked pages of data to a persistent storage device coupled with the single socket multi-core processor. The logic may also cause self-refresh operations for the remaining segments mapped to the second virtual local memory to be turned off.

Example 16. An example at least one machine readable medium may include a plurality of instructions that in response to being executed by a system, may cause the system to map a first portion of cores of a single socket multi-core processor to a first virtual NUMA node and map a second portion of the cores to a second virtual NUMA node. For this example, the second portion of the cores does not include any cores included in the first portion of cores and partition a DRAM device into multiple segments, each segment capable of having self-refresh operations separately deactivated or activated. The instructions may also cause the system to map at least one segment from among the multiple segments to a first virtual local memory of the first virtual NUMA node and map remaining segments from among the multiple segments to a second virtual local memory of the second virtual NUMA node. The instructions may also cause the system to cause a memory request to allocate memory for a pinned or a locked page of data to be directed to the first virtual NUMA node.

Example 17. The at least one machine readable medium of example 16, the memory request may be received from an application to be executed by the single socket multi-core processor. For this example, the instructions may further cause the system to cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

Example 18. The at least one machine readable medium of example 17, the indication in the memory request that the pinned or locked page of data is to be allocated to the at least one segment mapped to the first virtual local memory or based on the memory request targeting the allocation of memory for use by the first virtual NUMA node may be based on the application being capable of using a NUMA API to query an operating system executed by the single socket multi-core processor to determine that the at least one segment is mapped to the first virtual local memory.

Example 19. The at least one machine readable medium of example 16, the memory request may be received from an application to be executed by the single socket multi-core processor. For this example, the instructions may further cause the system to cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

Example 20. The at least one machine readable medium of example 16, the memory request may be received from an application to be executed by the single socket multi-core processor. For this example, the instructions may further cause the system to receive an indication that a system that includes the single socket multi-core processor is to enter an idle power state. The instructions may also cause the system to determine whether any pinned or locked pages of data have been allocated to the remaining segments mapped to the second virtual local memory. The instructions may also cause the system to move pinned or locked pages of data based on the determination to the at least one segment mapped to the first virtual local memory. The instructions may also cause the system to move non-pinned or non-locked pages of data to a persistent storage device coupled with the single socket multi-core processor. The instructions may also cause the system to turn off self-refresh operations for the remaining segments mapped to the second virtual local memory.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. An apparatus comprising:
   circuitry coupled with a single socket multi-core processor, the circuitry to:
   map a first portion of cores of the single socket multi-core processor to a first virtual non-uniform memory architecture (NUMA) node and map a second portion of the cores to a second virtual NUMA node, wherein the second portion of the cores does not include any cores included in the first portion of cores;
   partition a dynamic random access memory (DRAM) device into multiple segments, each segment capable of having self-refresh operations separately deactivated or activated;

map at least one segment from among the multiple segments to a first virtual local memory of the first virtual NUMA node and map remaining segments from among the multiple segments to a second virtual local memory of the second virtual NUMA node;

cause a memory request to allocate memory for a pinned or a locked page of data to be directed to the first virtual NUMA node, the memory request received from an application to be executed by the single socket multi-core processor; and cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

2. The apparatus of claim 1, comprising the indication in the memory request that the pinned or locked page of data is to be allocated to the at least one segment mapped to the first virtual local memory or based on the memory request targeting the allocation of memory for use by the first virtual NUMA node is based on the application being capable of using a NUMA application programming interface (API) to query an operating system executed by the single socket multi-core processor to determine that the at least one segment is mapped to the first virtual local memory.

3. The apparatus of claim 1, wherein the circuitry is to:
cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

4. The apparatus of claim 1, further comprising the circuitry to:
receive an indication that a system that includes the single socket multi-core processor is to enter an idle power state;
determine whether any pinned or locked pages of data have been allocated to the remaining segments mapped to the second virtual local memory;
move pinned or locked pages of data based on the determination to the at least one segment mapped to the first virtual local memory;
move non-pinned or non-locked pages of data to a persistent storage device coupled with the single socket multi-core processor; and
turn off self-refresh operations for the remaining segments mapped to the second virtual local memory.

5. A method comprising:
mapping a first portion of cores of a single socket multi-core processor to a first virtual non-uniform memory architecture (NUMA) node and mapping a second portion of the cores to a second virtual NUMA node, wherein the second portion of the cores does not include any cores included in the first portion of cores;
partitioning a dynamic random access memory (DRAM) device into multiple segments, each segment capable of having self-refresh operations separately deactivated or activated;

mapping at least one segment from among the multiple segments to a first virtual local memory of the first virtual NUMA node and mapping remaining segments from among the multiple segments to a second virtual local memory of the second virtual NUMA node;

causing a memory request to allocate memory for a pinned or a locked page of data to be directed to the first virtual NUMA node, the memory request received from an application to be executed by the single socket multi-core processor; and causing a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

6. The method of claim 5 further comprising:
causing the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

7. The method of claim 6, comprising the indication in the memory request that the pinned or locked page of data is to be allocated to the at least one segment mapped to the first virtual local memory or based on the memory request targeting the allocation of memory for use by the first virtual NUMA node is based on the application being capable of using a NUMA application programming interface (API) to query an operating system executed by the single socket multi-core processor to determine that the at least one segment is mapped to the first virtual local memory.

8. The method of claim 5, further comprising:
receiving an indication that a system that includes the single socket multi-core processor is to enter an idle power state;
determining whether any pinned or locked pages of data have been allocated to the remaining segments mapped to the second virtual local memory;
moving pinned or locked pages of data based on the determination to the at least one segment mapped to the first virtual local memory;
moving non-pinned or non-locked pages of data to a persistent storage device coupled with the single socket multi-core processor; and
turning off self-refresh operations for the remaining segments mapped to the second virtual local memory.

9. A system comprising:
a dynamic random access memory (DRAM) device;
a single socket multi-core processor coupled with the DRAM device; and
an operating system to be executed by the single socket multi-core processor, the operating system to include logic to:
map a first portion of cores of the single socket multi-core processor to a first virtual non-uniform memory architecture (NUMA) node and map a second portion of the cores to a second virtual NUMA node, wherein the second portion of the cores does not include any cores included in the first portion of cores;

partition the DRAM device into multiple segments, each segment capable of having self-refresh operations separately deactivated or activated;

map at least one segment from among the multiple segments to a first virtual local memory of the first virtual NUMA node and map remaining segments from among the multiple segments to a second virtual local memory of the second virtual NUMA node; and cause a memory request to allocate memory for a pinned or a locked page of data to be directed to the first virtual NUMA node, the memory request received from an application to be executed by the single socket multi-core processor; and cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

10. The system of claim 9, comprising the indication in the memory request that the pinned or locked page of data is to be allocated to the at least one segment mapped to the first virtual local memory or based on the memory request targeting the allocation of memory for use by the first virtual NUMA node is based on the application being capable of using a NUMA application programming interface (API) to query an operating system executed by the single socket multi-core processor to determine that the at least one segment is mapped to the first virtual local memory.

11. The system of claim 9, wherein the operating system logic is to:
cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

12. The system of claim 9, further comprising the operating system logic to:
receive an indication that a system that includes the single socket multi-core processor is to enter an idle power state;
determine whether any pinned or locked pages of data have been allocated to the remaining segments mapped to the second virtual local memory;
move pinned or locked pages of data based on the determination to the at least one segment mapped to the first virtual local memory;
move non-pinned or non-locked pages of data to a persistent storage device coupled with the single socket multi-core processor; and
cause self-refresh operations for the remaining segments mapped to the second virtual local memory to be turned off.

13. At least one machine readable medium comprising a plurality of instructions that in response to being executed by a system, cause the system to:
map a first portion of cores of a single socket multi-core processor to a first virtual non-uniform memory architecture (NUMA) node and map a second portion of the cores to a second virtual NUMA node, wherein the second portion of the cores does not include any cores included in the first portion of cores;

partition a dynamic random access memory (DRAM) device into multiple segments, each segment capable of having self-refresh operations separately deactivated or activated;

map at least one segment from among the multiple segments to a first virtual local memory of the first virtual NUMA node and map remaining segments from among the multiple segments to a second virtual local memory of the second virtual NUMA node; and cause a memory request to allocate memory for a pinned or a locked page of data to be directed to the first virtual NUMA node, the memory request received from an application to be executed by the single socket multi-core processor; and cause the memory request for the pinned or locked page of data to be directed to the first virtual NUMA node based on an indication in the memory request that a pinned or locked page is to be allocated to the at least one segment mapped to the first virtual local memory or based on the memory request targeting an allocation of memory for use by the first virtual NUMA node to execute at least a portion of a workload for the application.

14. The at least one machine readable medium of claim 13, comprising the indication in the memory request that the pinned or locked page of data is to be allocated to the at least one segment mapped to the first virtual local memory or based on the memory request targeting the allocation of memory for use by the first virtual NUMA node is based on the application being capable of using a NUMA application programming interface (API) to query an operating system executed by the single socket multi-core processor to determine that the at least one segment is mapped to the first virtual local memory.

15. The at least one machine readable medium of claim 13, the instructions to further cause the system to:
cause a second memory request to allocate memory to a page of data to be directed to the second virtual NUMA node based on the second memory request not including an indication that the page of data is to be pinned or locked and based on the memory request targeting an allocation of memory for use by the second virtual NUMA node to execute at least a portion of the application.

16. The at least one machine readable medium of claim 13, comprising the memory request received from an application to be executed by the single socket multi-core processor, the instructions to further cause the system to:
receive an indication that a system that includes the single socket multi-core processor is to enter an idle power state;
determine whether any pinned or locked pages of data have been allocated to the remaining segments mapped to the second virtual local memory;
move pinned or locked pages of data based on the determination to the at least one segment mapped to the first virtual local memory;
move non-pinned or non-locked pages of data to a persistent storage device coupled with the single socket multi-core processor; and
turn off self-refresh operations for the remaining segments mapped to the second virtual local memory.

* * * * *